US009840158B2

(12) United States Patent
Kim et al.

(10) Patent No.: US 9,840,158 B2
(45) Date of Patent: Dec. 12, 2017

(54) CURRENT MEASURING RELAY DEVICE

(71) Applicant: LG CHEM, LTD., Seoul (KR)

(72) Inventors: Younghwan Kim, Daejeon (KR); Ju Hyun Kang, Daejeon (KR); Dong Keun Kwon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 211 days.

(21) Appl. No.: 14/769,157

(22) PCT Filed: Aug. 25, 2014

(86) PCT No.: PCT/KR2014/007858
§ 371 (c)(1),
(2) Date: Aug. 20, 2015

(87) PCT Pub. No.: WO2015/030439
PCT Pub. Date: Mar. 5, 2015

(65) Prior Publication Data
US 2015/0375634 A1    Dec. 31, 2015

(30) Foreign Application Priority Data

Aug. 28, 2013  (KR) .................... 10-2013-0102626
Apr. 10, 2014  (KR) .................... 10-2014-0042768

(51) Int. Cl.
*H01H 35/00*    (2006.01)
*B60L 11/18*    (2006.01)
*G01R 19/165*    (2006.01)
*H02H 3/08*    (2006.01)

(52) U.S. Cl.
CPC .... *B60L 11/1851* (2013.01); *G01R 19/16542* (2013.01); *H02H 3/08* (2013.01)

(58) Field of Classification Search
CPC ......... G01R 31/025; H02H 3/33; H02H 3/335
See application file for complete search history.

(56) References Cited

U.S. PATENT DOCUMENTS

| 4,370,692 A | | 1/1983 | Wellman, Jr. et al. |
|---|---|---|---|
| 5,734,245 A | * | 3/1998 | Terashima ......... G05B 19/4061 318/453 |
| 2002/0089804 A1 | | 7/2002 | Chea, Jr. |
| 2004/0213676 A1 | | 10/2004 | Phillips et al. |

(Continued)

FOREIGN PATENT DOCUMENTS

| EP | 1 104 073 A2 | 5/2001 |
|---|---|---|
| KR | 1991-0005111 B1 | 7/1991 |

(Continued)

OTHER PUBLICATIONS

Korean Office Action for Appl. No. 10-2014-0042768 dated Sep. 21, 2015 (w/ English translation).

(Continued)

*Primary Examiner* — Sibin Chen
(74) *Attorney, Agent, or Firm* — Birch, Stewart, Kolasch & Birch, LLP

(57) ABSTRACT

Provided is a current measuring relay device capable of measuring a current flowing in a relay and controlling an operation of the relay based on the measured result, without depending on a control operation of an external control device such as a battery management system (BMS) by integrating the relay with a current measuring sensor.

10 Claims, 3 Drawing Sheets

(56) References Cited

U.S. PATENT DOCUMENTS

2006/0146465 A1    7/2006  Esser
2010/0244845 A1*  9/2010  Morikawa .............. G01R 19/25
                                                        324/427

FOREIGN PATENT DOCUMENTS

| KR | 20-1998-0025800 U | 8/1998 |
| KR | 10-2001-0031042 A | 4/2001 |
| KR | 10-2006-0054633 A | 5/2006 |
| KR | 10-2007-0023074 A | 2/2007 |
| KR | 10-2013-0083177 A | 7/2013 |
| WO | WO 2006/115349 A1 | 11/2006 |
| WO | WO 2008/077161 A1 | 7/2008 |

OTHER PUBLICATIONS

Extended European Search Report for Appl. No. 14839069.3 dated Oct. 24, 2016.
International Search Report issued in PCT/KR2014/007858 dated Dec. 11, 2014.
Written Opinion of the International Searching Authority issued in PCT/KR2014/007858 dated Dec. 11, 2014.

* cited by examiner

[Figure 1]
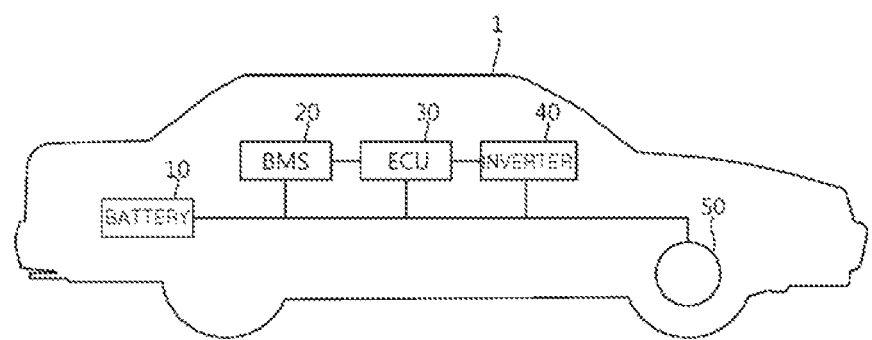
[Figure 2]
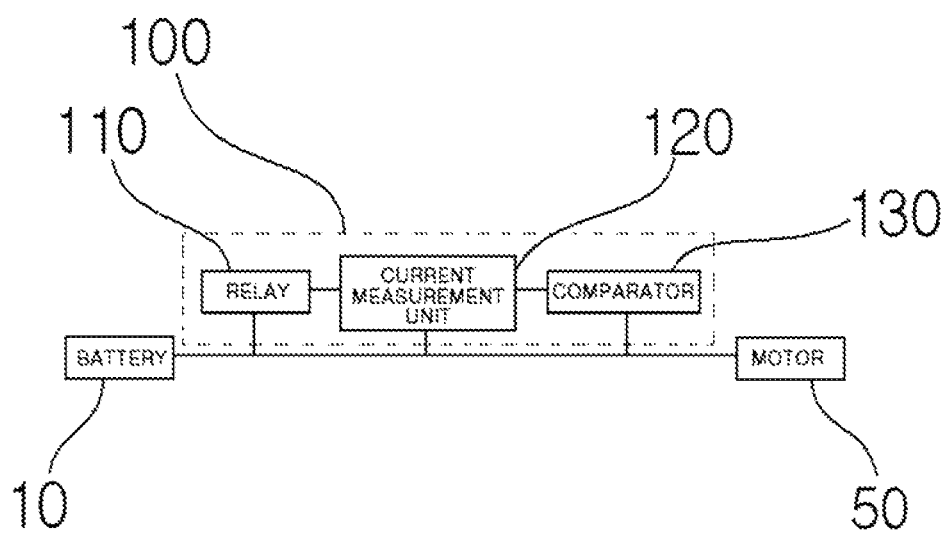

[Figure 3]
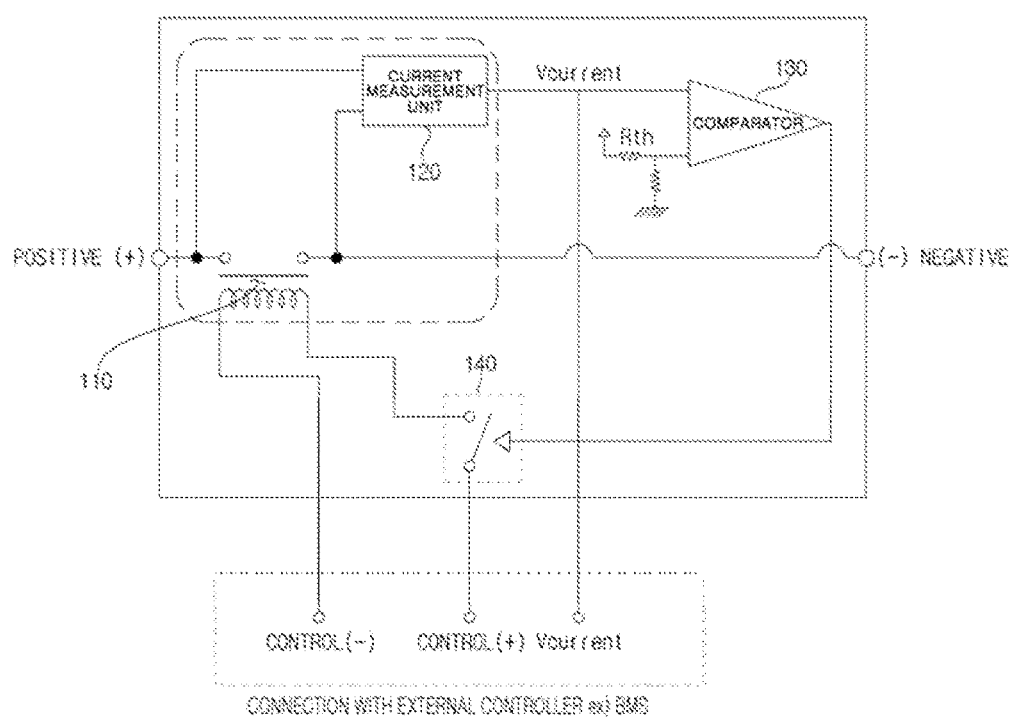

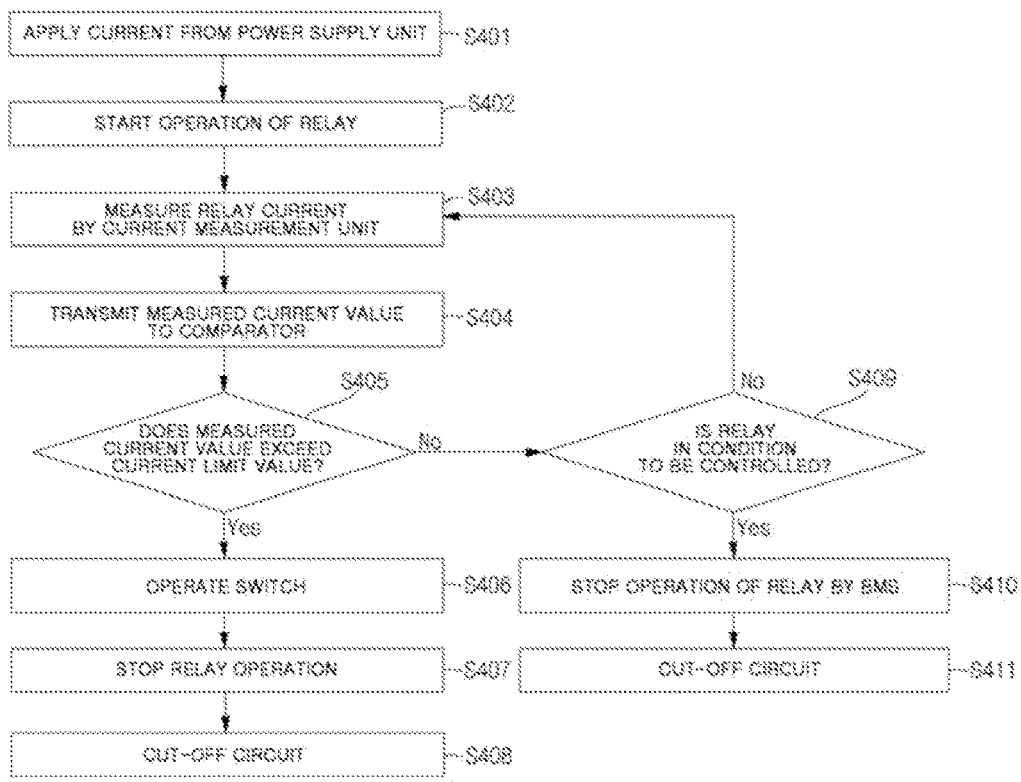
[Figure 4]

CURRENT MEASURING RELAY DEVICE

TECHNICAL FIELD

This application claims priority to and the benefit of Korean Patent Application Nos. 10-2013-0102626 and 10-2014-0042768 filed in Korean Intellectual Property Office on Aug. 28, 2013, and on Apr. 10, 2014, the entire contents of which are incorporated herein by reference.

The present invention relates to a current measuring relay device, and more particularly, to a current measuring relay device capable of measuring a current flowing in a relay and controlling an operation of the relay based on the measured result, without depending on a control of an external control device such as a battery management system (BMS) by integrating the relay with a current measuring sensor.

BACKGROUND ART

Recently, due to the surge in growth of the industry and the economy, a technology of controlling a relay switch based on a measurement result (for example, overvoltage conduction sensing result, low voltage conduction sensing result, or the like) by a current measuring sensor which is separately attached to measure a current flowing between a driving motor and a battery, for connecting between the driving motor and the battery, which are essentially used in a vehicle (for example, electric vehicle, and the like), using a battery as a main power source has been developed.

Describing a technology relating to the existing relay control as described above, Korean Application Patent Laid-Open No. 10-2007-0023074 discloses a wiper protecting system using an overcurrent of a washer motor, in which a current sensor unit may sense a current input to a washer motor unit to turn on/off a state of a wiper relay based on a sensed current.

However, according to the existing relay control technology as described above, since the current measuring sensor is not connected to the relay but is connected to a circuit and an ECU receives the sensed overvoltage signal from the circuit and then operates the relay based on the received overvoltage signal, the relay may not be preferentially operated which may cause damage to the circuit and threaten the safety of a user when a high current flows in the circuit. In addition to the above the current measuring sensor needs to be separately attached and thus manufacturing costs of the circuit may be increased.

Therefore, to solve the problems of the existing relay control technology as described above, the present inventors have invented a current measuring relay device which may measure a current flowing in a relay and control an operation of the relay based on the measured result without depending on a control of an external control device such as a battery management system (BMS) by integrating the relay with a current measuring sensor to make the relay be preferentially operated when a high current flows in a circuit, thereby protecting the circuit.

DETAILED DESCRIPTION OF THE INVENTION

Technical Problem

The present invention has been made in an effort to provide a current measuring relay device capable of measuring a current flowing in a relay and controlling an operation of the relay based on the measured result, without depending on a control of an external control device such as a battery management system (BMS) by integrating the relay with a current measuring sensor.

In detail, the present invention has been made in an effort to provide a current measuring relay device capable of protecting a circuit by preferentially turning off a connection of a relay when a flow of high current is sensed by directly measuring the current flowing in the relay using a current measuring sensor.

Technical Solution

An exemplary embodiment of the present invention provides a current measuring relay device including: a relay provided in a circuit, a current measurement unit measuring a current of the relay, a comparator comparing a measured current value with a preset current limit value, and a switch connected to the comparator to control an operation of the relay depending on whether the measured current value exceeds the current limit value.

The relay and the current measurement unit may be integrated to be modularized.

The current measurement unit may include a current sensor corresponding to at least one of a current transformer type, a hall element type, and a fuse type.

The current measurement unit may measure at least one of an alternating current and a direct current.

The comparator may transmit an excessive sensing signal to the switch when the measured current value exceeds the current limit value.

The switch may turn on or off a power supply of the relay.

When the switch receives the excessive sensing signal, a state of the switch may be changed from a turn on state to a turn off state and thus the operation of the relay may stop.

The state of the switch may be changed from the turn on state to the turn off state regardless of whether a battery management system (BMS) is normally operated, when the measured current value exceeds the current limit value.

When the measured current value does not exceed the current limit value and the state of the switch needs to be changed from the turn on state to the turn off state, the state of the switch may be changed from the turn on state to the turn off state depending on the control of the BMS.

Advantageous Effects

According to the exemplary embodiments of the present invention, the current measuring relay device may cut off the relay depending on the value of current flowing in the relay by integrating the relay with the current sensor, thereby further reducing the manufacturing costs of the circuit than the existing configuration in which the relays are each connected to the current sensors.

Further, the current measuring relay device may be independently operated without depending on the control of the external control device such as the battery management system (BMS), thereby cutting-off the relay at the time of the occurrence of overcurrent even though the external control device has abnormalities such as failure.

Further, according to the exemplary embodiments of the present invention, since the relay is connected to the current sensor, when the power supply of the relay is turned on, the current of the relay may be automatically measured.

Further, according to the exemplary embodiments of the present invention, when the current measuring sensor directly measures the current flowing in the relay to sense the flow of high current, the connection of the relay is preferentially turned off, thereby preventing damage to the circuit and an electric shock to the user.

BRIEF DESCRIPTION OF DRAWINGS

FIG. 1 is a block diagram illustrating a configuration of an electric vehicle 10 according to the related art.

FIG. 2 is a block diagram illustrating a configuration of a current measuring relay device 100 according to an exemplary embodiment of the present invention.

FIG. 3 is a circuit diagram illustrating a circuit of the current measuring relay device 100 according to the exemplary embodiment of the present invention.

FIG. 4 is a flow chart illustrating in more detail an operation order of the current measuring relay device 100 according to the exemplary embodiment of the present invention.

BEST MODE

Hereinafter, the present invention will be described in detail with reference to the accompanying drawings. In the present specification, an overlapped description and a detailed description for well-known functions and configurations that may unnecessarily obscure the gist of the present invention will be omitted. Rather, exemplary embodiments of the present invention are provided so that this disclosure will be thorough and complete, and will fully convey the concept of the invention to those skilled in the art. Therefore, throughout the accompanying drawings, shapes, sizes, and the like, of components may be exaggerated for clarity.

In the specification, unless explicitly described to the contrary, the word "comprise" and variations such as "comprises" or "comprising", will be understood to imply the inclusion of stated elements but not the exclusion of any other elements.

FIG. 1 is a block diagram illustrating a configuration of an electric vehicle 1 according to the related art.

Referring to FIG. 1, the electric vehicle 1 may be configured to include a battery 10, a battery management system (BMS) 20, an electronic control unit (ECU) 30, an inverter 40, and a motor 50.

The battery 10 is an energy source which provides a driving force to the motor 50 to drive the electric vehicle 1. The battery 10 may be charged or discharged by the inverter 40 depending on driving of the motor 50 and/or an internal combustion engine (not illustrated).

Here, a type of battery 10 is not particularly limited, and therefore as the battery 10, there may be a lithium ion battery, a lithium polymer battery, a nickel cadmium battery, a nickel hydrogen battery, a nickel zinc battery, and the like.

Further, the battery 10 is configured as a battery pack in which a plurality of battery cells are connected in series and/or in parallel. Further, the battery pack may be provided with one or more to form the battery 10.

The BMS 20 estimates a state of the battery 10 and manages the battery 10 using the estimated state information. For example, the BMS 20 estimates and manages the state information of the battery 10 such as a state of charging (SOC), a state of health (SOH), a maximum input/output power tolerable amount, an output voltage, and the like of the battery 10. Further, the BMS 10 may control charging or discharging of the battery 10 using the state information and may also estimate replacement timing of the battery.

The ECU 30 is an electronic control device which controls the state of the electric vehicle 1. For example, the ECU 30 determines a torque amount based on information such as an accelerator, a brake, and a speed, and controls an output of the motor 50 to meet torque information.

Further, the ECU 30 transmits a control signal to the inverter 40 so that the battery 10 may be charged or discharged based on the state information of the SOC, the SOH, and the like of the battery 10 which are transferred from the BMS 20.

The inverter 40 charges or discharges the battery 10 based on the control signal of the ECU 30.

The motor 50 drives the electric vehicle 1 using electric energy of the battery 10 based on the control information (for example, torque information) which is transferred from the ECU 30.

The above-mentioned electric vehicle 1 is driven using the electric energy of the battery 10, in which the battery 10 and the motor 50 are connected to each other through various circuits. In this case, a current having different potential differences from a micro current to a high current may flow in the circuits and therefore a circuit protective device such as a relay is preferably provided to protect the battery 10 and the motor 50 from the current.

FIG. 2 is a block diagram illustrating a configuration of a current measuring relay device 100 according to an exemplary embodiment of the present invention and FIG. 3 is a circuit diagram illustrating a circuit of the current measuring relay device 100 according to the exemplary embodiment of the present invention.

Referring to FIGS. 2 and 3, the current measuring relay device 100 includes a relay 110, a current measurement unit 120, a comparator 130, and a switch 140.

First, the relay 110 may serve to control conduction of the circuit connected between the battery 10 and the motor 50 and may include an internal coil having magnetism to conduct a current, so that while iron plates spaced apart from each other therein are also closed by magnetism, a current flows therein.

Meanwhile, the relay 110 uses the existing known technologies and therefore the detailed description thereof will be omitted.

Next, the current measurement unit 120 may serve to measure the current flowing in the relay 110 and is located to contact both ends (positive pole and negative pole) of the relay 110 so as to measure the potential difference of the relay 110.

The current measurement unit 120 which performs the function may include a current sensor which corresponds to at least one of a current transformer type, a hall element type, and a fuse type.

Herein, the current sensor may mean a sensor which measures a flowing alternating current amount and direct current amount.

Further, according to the present invention, the above-mentioned relay 110 and current measurement unit 120 may be integrated to be modularized, and therefore when the relay 110 and the circuit are connected to each other to make a current flow, the corresponding current value may be essentially measured by the current measurement unit 120.

Therefore, when power is applied to the relay 110, the current measurement unit 120 may automatically measure the current of the relay 110.

Further, when a current measured by the relay 110 corresponds to a high current, the current measurement unit 120 may further include a ballast (for example, a resistor having a high resistance value) (not illustrated) for protecting the inside of the relay 110.

Meanwhile, it is to be noted that the current value measured by the current measurement unit 120 may be transferred to the comparator 130 to be described below and a kind of current sensor of the current measurement unit 120 is not limited as long as the current measurement unit 120 performs the above-mentioned function.

Next, the comparator 130 may serve to receive the measured current value from the current measurement unit 120 and compare and determine the received current value with the preset current limit value (for example, maximum current value at which the circuit may be normally operated).

In this case, when the measured current value exceeds the preset current limit value, the comparator 130 may transmit an excessive sensing signal to the switch 140 to be described below and when the measured current value does not exceed the preset current limit value, does not transmit the excessive sensing signal.

According to the exemplary embodiment of the present invention, likewise the current measurement unit 120, the comparator 130 may be further provided with a separate ballast (for example, a resistor having a high resistance value, and the like) (not illustrated), and therefore may be configured to protect the inside of the relay 110 from a high current.

Finally, the switch 140 receives the excessive sensing signal from the comparator 130, and therefore may serve to control the operation of the relay 110.

In more detail, a switch 150 may be formed between a positive pole of a power supply unit 60 and the relay 110 to connect the positive pole of the power supply unit 60 to the relay 110 and when the switch 140 receives the excessive sensing signal from the comparator 130, the switch 140 may cut off the power supplied to the relay 110 while the state of the switch 140 is changed to a turn off state. Therefore, the operation of the relay 110 stops to cut off the circuit.

To the contrary, when the switch 140 does not receive the excessive sensing signal from the comparator 130, the switch 140 may continuously operate the relay 110 while the switch 140 keeps a turn on state, such that a flow continuously flows in the circuit.

According to the exemplary embodiment of the present invention, the switch 140 may correspond to a transistor (not illustrated) and the state of the switch 140 may be changed from the turn on state to the turn off state depending on the excessive sensing signal transferred from the comparator 130. That is, when the excessive sensing signal is not received from the comparator 130, the switch 140 maintains the turn on state and when the excessive sensing signal is received from the comparator 130, the contact of the relay 110 is short-circuited while the state of the switch 140 is changed to the turn off state and thus the operation of the relay 110 may stop.

Meanwhile, the switch 140 may differ from the battery management system (BMS) which controls the battery and may control the operation of the relay 110 independent of whether the BMS is provided and the control function of the BMS.

FIG. 4 is a flow chart illustrating in more detail an operation order of the current measuring relay device 100 according to exemplary embodiment of the present invention.

Referring to FIG. 4, first, a current which is applied from the power supply unit 60 to the circuit (S401) changes the state of the switch 140 of the relay 110 connected to the corresponding circuit to the turn on state, such that the operation of the relay 110 starts (S402).

The current measurement unit 120 measures the current value flowing through both ends of the relay 110 (S403) and transmits the measured current value to the comparator 130 (S404).

The comparator 130 compares the measured current value with the preset current limit value and determines whether the measured current value exceeds the current limit value based on the comparison result (S405).

If it is determined that the measurement current value exceeds the current limit value, the switch 140 is changed from the turn on state to the turn off state independent of whether the BMS is normally operated (S406), such that the operation of the relay 110 stops (S407) and the circuit is cut off (S408).

When the state of the relay 110 is changed from the turn on state to the turn off state under the condition that the measured current value does not exceed the current limit value (S409) (for example, when the vehicle is in a parking state after the driving of the vehicle ends), the BMS directly controls the relay 110 to change the state of the relay 110 from the turn on state to the turn off state, such that the operation of the relay stops (S410).

Therefore, the circuit is cut off (S411).

To the contrary, when the state of the relay 110 is not changed from the turn on state to the turn off state under the condition that the measured current value does not exceed the current limit value, the current measurement unit 120 again measures the current value flowing through both ends of the relay 110.

While the present invention has been described in connection with the exemplary embodiments of the present invention, it will be apparent to those skilled in the art that various modifications and variations can be made without departing from the spirit and scope of the invention as defined by the appended claims. In the configuration of FIG. 4, since a plurality of gears are directly engaged with each other, a friction force generated while protrusions of a first gear 111, a second gear 121, and a rotating shaft gear 131 contact one another may offset energy efficiency to some extent, while in the configuration of FIG. 5, t since the friction force is not present, energy efficiency may not be offset.

According to the exemplary embodiment of the present invention, an inner surface of a belt, that is, a surface at which the first gear 111 contacts the second gear 121 may be provided with protrusions protruding at a predetermined interval.

Herein, the protrusions protruding at a predetermined interval may mean a rugged structure formed in the inner surface like a timing belt of a vehicle engine and may be formed to correspond to the interval of the protrusions formed at the first gear 111 and the second gear 121. Therefore, the belt may be engaged with the first gear 111 and the second 121 without being spaced apart therefrom, deliver a rotating force of a first ACDC motor generator 110 to a second ACDC motor generator 120 or a rotating force of the second ACDC motor generator 120 to the first ACDC motor generator 110 as it is, and prevent the first ACDC motor generator 110 and the second ACDC motor generator 120 from idling from each other.

As described above, a bi-directional power conversion device according to the exemplary embodiment of the present invention may connect the first ACDC motor generator 110 and the second ACDC motor generator 120 through a physical connection (rotating shaft 130 or belt) without a separate insulating element 11 and may have a simple circuit and an overall reduced size, as compared with the existing converter 10 using the insulating element 11.

Further, the bi-directional power conversion device according to the exemplary embodiment of the present invention supplies produced AC power or insulated DC power to the battery to charge the battery.

Although specific exemplary embodiments of the present invention have been described as above and illustrated in the drawings, the technical spirit of the present invention is not limited to the accompanying drawings and the contents described above, it is obvious to those skilled in the art that the present invention can be modified and changed in various forms without departing from the spirit of the present invention, and it should be interpreted that the modifications are included in the claims of the present invention without departing from the spirit of the present invention.

The invention claimed is:

1. A current measuring relay device, comprising:
a relay provided in a circuit;
a current measurement unit configured to measure a current of the relay;
a comparator including first and second inputs, the first input connected to both the current measurement unit and a battery management system (BMS) operatively connected and external to the current measuring relay device, the second input connected to ground, the comparator configured to compare the measured current value with a preset current limit value; and
a switch configured to control an operation of the relay based on a signal transmitted by the comparator when the measured current value exceeds the current limit value, and based on a signal transmitted by the BMS when the measured current value does not exceed the current limit value.

2. The current measuring relay device of claim 1, wherein the relay and the current measurement unit are integrated to be modularized.

3. The current measuring relay device of claim 1, wherein the current measurement unit includes a current sensor corresponding to at least one of a current transformer type, a hall element type, and a fuse type.

4. The current measuring relay device of claim 1, wherein the current measurement unit measures at least one of an alternating current and a direct current.

5. The current measuring relay device of claim 1, wherein the comparator transmits an excessive sensing signal to the switch when the measured current value exceeds the current limit value.

6. The current measuring relay device of claim 5, wherein the switch turns on or off a power supply of the relay.

7. The current measuring relay device of claim 6, wherein when the switch receives the excessive sensing signal, a state of the switch is changed from a turn on state to a turn off state and thus an operation of the relay stops.

8. The current measuring relay device of claim 1, wherein the state of the switch is changed from the turn on state to the turn off state regardless of whether the BMS is normally operated, when the measured current value exceeds the current limit value.

9. The current measuring relay device of claim 1, wherein when the measured current value does not exceed the current limit value and the state of the switch needs to be changed from the turn on state to the turn off state, the state of the switch is changed from the turn on state to the turn off state depending on the control of the BMS.

10. The current measuring relay device of claim 1, wherein, when the measured current value exceeds the current limit value, a changing of a state of the switch is controlled by the current measurement unit and the comparator, instead of by the BMS controlling of the changing of the state of the switch when the measured current value does not exceed the current limit value.

* * * * *